(12) United States Patent
Li et al.

(10) Patent No.: US 10,607,854 B2
(45) Date of Patent: Mar. 31, 2020

(54) MANUFACTURING METHOD OF ELECTRODE PATTERN, THIN FILM TRANSISTOR AND MANUFACTURING METHOD THEREOF, AND DISPLAY PANEL

(71) Applicant: BOE TECHNOLOGY GROUP CO., LTD., Beijing (CN)

(72) Inventors: Haixu Li, Beijing (CN); Zhanfeng Cao, Beijing (CN); Qi Yao, Beijing (CN); Jianguo Wang, Beijing (CN); Fanna Meng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/322,308

(22) PCT Filed: May 31, 2018

(86) PCT No.: PCT/CN2018/089111
§ 371 (c)(1),
(2) Date: Jan. 31, 2019

(87) PCT Pub. No.: WO2018/223879
PCT Pub. Date: Dec. 13, 2018

(65) Prior Publication Data
US 2019/0198348 A1   Jun. 27, 2019

(30) Foreign Application Priority Data

Jun. 5, 2017   (CN) .......................... 2017 1 0416020

(51) Int. Cl.
*H01L 21/311*   (2006.01)
*H01L 21/3213*   (2006.01)
*H01L 29/786*   (2006.01)

(52) U.S. Cl.
CPC .. *H01L 21/32134* (2013.01); *H01L 21/31111* (2013.01); *H01L 21/32139* (2013.01); *H01L 29/78606* (2013.01)

(58) Field of Classification Search
None
See application file for complete search history.

(56) References Cited

U.S. PATENT DOCUMENTS

2003/0122987 A1*   7/2003   Kim ....................... G02F 1/1368
                                                                         349/43
2014/0116863 A1*   5/2014   Lee ......................... G06F 3/041
                                                                        200/279

(Continued)

FOREIGN PATENT DOCUMENTS

CN    104617111 A    5/2015
CN    105784254 A    7/2016

(Continued)

OTHER PUBLICATIONS

Zhang et al; New Journal of chemistry; "Cerium-based M4L4 Tetradedrons containing Hydrogen bond groups as functional molecular flasks for selective reaction prompting"; 2013,00,p. 1-10. (Year: 2013).*

(Continued)

*Primary Examiner* — Shamim Ahmed
(74) *Attorney, Agent, or Firm* — Collard & Roe, P.C.

(57) ABSTRACT

Provided in an embodiment of the present invention are a manufacturing method of an electrode pattern, a thin film transistor and a manufacturing method thereof, and a display panel. The manufacturing method of an electrode pattern includes: forming a metal thin film; performing processing on the metal thin film to form a partner layer over a surface of the metal thin film, the partner layer being configured to (Continued)

react with a photoresist to form a hydrogen bond; and performing patterning to form an electrode.

15 Claims, 7 Drawing Sheets

(56) References Cited

U.S. PATENT DOCUMENTS

| | | | |
|---|---|---|---|
| 2015/0014627 A1* | 1/2015 | Yu | H01L 27/14665 257/13 |
| 2016/0011457 A1* | 1/2016 | Zhang | G02F 1/133512 438/29 |
| 2017/0263645 A1 | 9/2017 | Liu et al. | |
| 2019/0198348 A1 | 6/2019 | Li et al. | |

FOREIGN PATENT DOCUMENTS

| | | |
|---|---|---|
| CN | 105789218 A | 7/2016 |
| CN | 105807563 A | 7/2016 |
| CN | 107204289 A | 9/2017 |
| KR | 101275999 B1 | 6/2013 |

OTHER PUBLICATIONS

International Search Report of PCT/CN2018/089111 in Chinese, dated Sep. 4, 2018, with English translation.
Notice of Transmittal of the International Search Report of PCT/CN2018/089111 in Chinese, dated Sep. 4, 2018.
Written Opinion of the International Searching Authority of PCT/CN2018/089111 in Chinese, dated Sep. 4, 2018 with English translation.
Chinese Office Action in Chinese Application No. 201710416020.0, dated Mar. 11, 2019 with English translation.

* cited by examiner

S101 Forming a metal film

S102 Forming a partner layer on a surface of the metal film by subjecting the metal film to a treatment, wherein the partner layer is configured to interact with a photoresist to form a hydrogen bond S103 Patterning the metal film to provide an electrode pattern

MANUFACTURING METHOD OF ELECTRODE PATTERN, THIN FILM TRANSISTOR AND MANUFACTURING METHOD THEREOF, AND DISPLAY PANEL

CROSS REFERENCE TO RELATED APPLICATIONS

This application is the National Stage of PCT/CN2018/089111 filed on May 31, 2018, which claims priority under 35 U.S.C. § 119 of Chinese Application No. 201710416020.0 filed on Jun. 5, 2017, the disclosure of which is incorporated by reference.

TECHNICAL FIELD

Embodiments of the present disclosure relate to a manufacturing method of an electrode pattern, a thin film transistor, a manufacturing method thereof, and a display panel.

BACKGROUND

With the development of display technology, the development of flat display panels such as organic electroluminescent display panels and liquid crystal display panels is very rapid.

Taking the liquid crystal display panel for example, the liquid crystal display panel includes an array substrate, which includes: a base substrate, a thin film transistor on the base substrate, and a pixel electrode. The thin film transistor includes an active layer, a gate electrode, a source electrode, and a drain electrode. In a process of manufacturing the thin film transistor, manufacturing the gate electrode, the source electrode, and the drain electrode includes depositing a metal film, coating the metal film with a photoresist, exposing and developing the photoresist to form a photoresist pattern, etching the metal film by using the photoresist pattern as a mask, and stripping the photoresist, etc.

SUMMARY

At least one embodiment of the present disclosure provides a manufacturing method of an electrode pattern, and the manufacturing method includes: forming a metal film; forming a partner layer on a surface of the metal film by subjecting the metal film to a treatment, wherein the partner layer is configured to interact with a photoresist to form a hydrogen bond; and patterning the metal film on the surface of which the partner layer is formed to provide the electrode pattern.

For example, in the manufacturing method provided by at least one embodiment of the present disclosure, the treatment includes: treating the metal film with a first solution by using a wet etching equipment; wherein the first solution comprises dimethylformamide as a solvent and comprises a mixture of nitric acid and a compound having a molecular formula of $C_{57}H_{42}N_{12}O_6 \cdot H_2O$ as a solute.

For example, in the manufacturing method provided by at least one embodiment of the present disclosure, the compound has a mass percentage of from about 30% to about 50%.

For example, in the manufacturing method provided by at least one embodiment of the present disclosure, a duration for the treatment is more than or equal to about 2 minutes, and a temperature for the treatment is from about 40° C. to about 50° C.

For example, in the manufacturing method provided by at least one embodiment of the present disclosure, the patterning the metal film on the surface of which the partner layer is formed to provide the electrode pattern includes: coating the metal film with the photoresist; exposing and developing the photoresist; etching the metal film; and stripping the photoresist to form the electrode pattern.

For example, in the manufacturing method provided by at least one embodiment of the present disclosure, an interval between the exposing and developing the photoresist and the forming the partner layer is less than or equal to about 30 minutes.

At least one embodiment of the present disclosure further provides a manufacturing method of a thin film transistor, and the manufacturing method includes: forming a metal film; forming a partner layer on a surface of the metal film by subjecting the metal film to a treatment, wherein the partner layer is configured to interact with a photoresist to form a hydrogen bond; and patterning the metal film on the surface of which the partner layer is formed to provide an electrode; wherein the electrode is at least one of a gate electrode, a first source/drain electrode and a second source/drain electrode of the thin film transistor.

For example, in the manufacturing method provided by at least one embodiment of the present disclosure, the treatment includes: treating the metal film with a first solution by using a wet etching equipment; wherein the first solution comprises dimethylformamide as a solvent and comprises a mixture of nitric acid and a compound having a molecular formula of $C_{57}H_{42}N_{12}O_6 \cdot H_2O$ as a solute.

For example, in the manufacturing method provided by at least one embodiment of the present disclosure, the compound has a mass percentage of from about 30% to about 50%.

For example, in the manufacturing method provided by at least one embodiment of the present disclosure, a duration for the treatment is more than or equal to about 2 minutes, and a temperature for the treatment is from about 40° C. to about 50° C.

For example, in the manufacturing method provided by at least one embodiment of the present disclosure, the patterning the metal film on the surface of which the partner layer is formed to provide the electrode pattern includes: coating the metal film with the photoresist; exposing and developing the photoresist; etching the metal film; and stripping the photoresist to form the electrode; wherein an interval between the exposing and developing the photoresist and the forming the partner layer is less than or equal to about 30 minutes.

At least one embodiment of the present disclosure further provides a thin film transistor, and the thin film transistor includes: a gate electrode, a first source/drain electrode and a second source/drain electrode; wherein at least one of the gate electrode, the first source/drain electrode and the second source/drain electrode is an electrode comprising a partner layer and a conductive layer, wherein the conductive layer is covered by the partner layer which is configured to interact with a photoresist to form a hydrogen bond.

For example, in the thin film transistor provided by at least one embodiment of the present disclosure, the partner layer comprises a triazine ring, an imino group, an amido group and an aromatic ring.

For example, in the thin film transistor provided by at least one embodiment of the present disclosure, the partner layer has a molecular formula of $Cu_6C_{228}H_{156}N_{48}O_{24} \cdot 4C_3H_7NO$ or $Ni_6C_{228}H_{156}N_{48}O_{24} \cdot 4C_3H_7NO$.

For example, in the thin film transistor provided by at least one embodiment of the present disclosure, a material of the conductive layer is metal.

At least one embodiment of the present disclosure further provides a display panel, and the display panel includes any one of the thin film transistors described above.

BRIEF DESCRIPTION OF THE DRAWINGS

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

DETAILED DESCRIPTION

In order to make objects, technical details and advantages of embodiments of the disclosure clear, the technical solutions of the embodiments will be described in a clearly and fully understandable way in connection with the related drawings. It is apparent that the described embodiments are just a part but not all of the embodiments of the disclosure. Based on the described embodiments herein, those skilled in the art can obtain, without any inventive work, other embodiment(s) which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and claims of the present application, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or mechanical connection, but may comprise an electrical connection which is direct or indirect. The terms "on," "under," "right," "left" and the like are only used to indicate relative position relationship, and in the case that the position of an object is described as being changed, the relative position relationship may be changed accordingly.

Widths of the source electrode and the drain electrode in a thin film transistor are too large, which affects a transmittance of light and becomes one of the key factors restricting a contrast and a resolution of a display panel. As user's requirements on the contrast and the resolution of the display panel become higher and higher, it is necessary to make the widths of the source electrode and the drain electrode in the thin film transistor smaller and smaller. However, in a process of patterning the metal films for forming the source electrode and the drain electrode, an adhesion between the photoresist formed on the metal films and the metal material is weak, and the narrow width of the metal film further reduces the adhesion between the photoresist and the metal material. Therefore, due to small widths of the source electrode and the drain electrode finally formed, the photoresist tends to be stripped off in the process of etching the metal film, which limits the scope of using the thin film transistor.

Figures 1, 2:
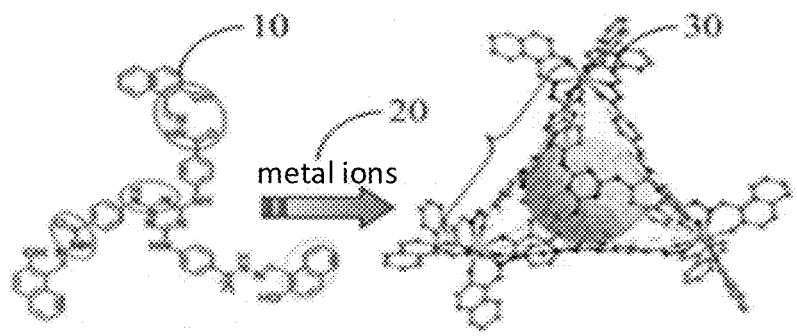
FIG. 1 is a flowchart of a manufacturing method of an electrode pattern provided by an embodiment of the present disclosure.
FIG. 2 is a schematic diagram of forming molecules of a partner layer provided by an embodiment of the present disclosure.

At least one embodiment of the present disclosure provides a manufacturing method of an electrode pattern. For example, FIG. 1 is a flowchart of a manufacturing method of an electrode pattern provided by an embodiment of the present disclosure. As illustrated in FIG. 1, the manufacturing method of the electrode pattern includes:

Step S101: forming a metal film.

For example, a material of the metal film includes a conductive metal material such as copper, aluminum, molybdenum, zinc, nickel or neodymium, or an alloy material formed by the above metal materials.

For example, the material of the metal film is a copper-based metal. The copper-based metal has the characteristics of low resistivity and good electrical conductivity, so it can enhance signal transmission rate of the source electrode and the drain electrode, and can improve a display quality.

For example, the copper-based metal is copper (Cu), copper-zinc alloy (CuZn), copper-nickel alloy (CuNi) or copper-zinc-nickel (CuZnNi), or any other stable copper-based metal alloy.

For example, the metal film can be deposited by a chemical vapor deposition (CVD) process, an evaporation process or a sputtering process. However, embodiments of the present disclosure are not limited to the above deposition processes.

Step S102: forming a partner layer on a surface of the metal film by subjecting the metal film to a treatment, wherein the partner layer is configured to interact with a photoresist to form a hydrogen bond.

For example, the treatment comprises: treating the metal film with a first solution by using a wet etching equipment.

For example, the first solution comprises dimethylformamide as a solvent, and comprises a mixture of nitric acid and a compound having a molecular formula of $C_{57}H_{42}N_{12}O_6 \cdot H_2O$ as a solute.

For example, the compound is made from methyl aminobenzoate, glacial acetic acid, cyanuric chloride, hydrazine hydrate, ethanol and 2-hydroxyl-1-naphthalaldehyde.

For example, the method of manufacturing the compound ($C_{57}H_{42}N_{12}O_6 \cdot H_2O$) is as follows: weighing 2.5 g of methyl p-amino benzoate and placing it in a 100 mL round bottom flask; then adding 75 mL of glacial acetic acid to the round bottom flask and mixing well; weighing 0.92 g of cyanogen chloride and slowly adding the cyanogen chloride to the mixture of methyl p-amino benzoate and glacial acetic acid to form an A solution; allowing the A solution to react in an oil bath at 100° C. with magnetic stirring or mechanical stirring for 30 min; after completing the reaction, adding 150 mL of hydrazine hydrate to form a B solution, allowing the B solution to react in an oil bath at 120° C. for 24 hours, adding 100 mL of ethanol during the reaction and performing the magnetic stirring or the mechanical stirring to form a C solution; weighing 0.87 g of 2-cyano-1-naphthoic acid and slowly adding it to the C solution, and then dropwisely adding 0.20 mL of glacial acetic acid as a catalyst to the C solution, and allowing the C solution to react in an oil bath at 95° C. with magnetic stirring or mechanical stirring for 24 hours, cooling and filtrating after the reaction, and washing a filter cake by ethanol and then drying the filter cake under vacuum to form a brown solid ($C_{57}H_{42}N_{12}O_6 \cdot H_2O$).

For example, the compound has a structural formula of form of X—H . . . Y, thereby forming the hydrogen bond. The atom Y is F, O or N and so on which has a partial negative charge. The hydrogen bond can be formed between the same kind of molecules, for example, the hydrogen bond can be formed between water molecules. It can also be formed between different kind of molecules, for example between ammonia and water ($NH_3 \cdot H_2O$). The hydrogen bond is a special molecular force, and its bond energy is smaller than that of a chemical bond, but larger than that of a usual intermolecular force.

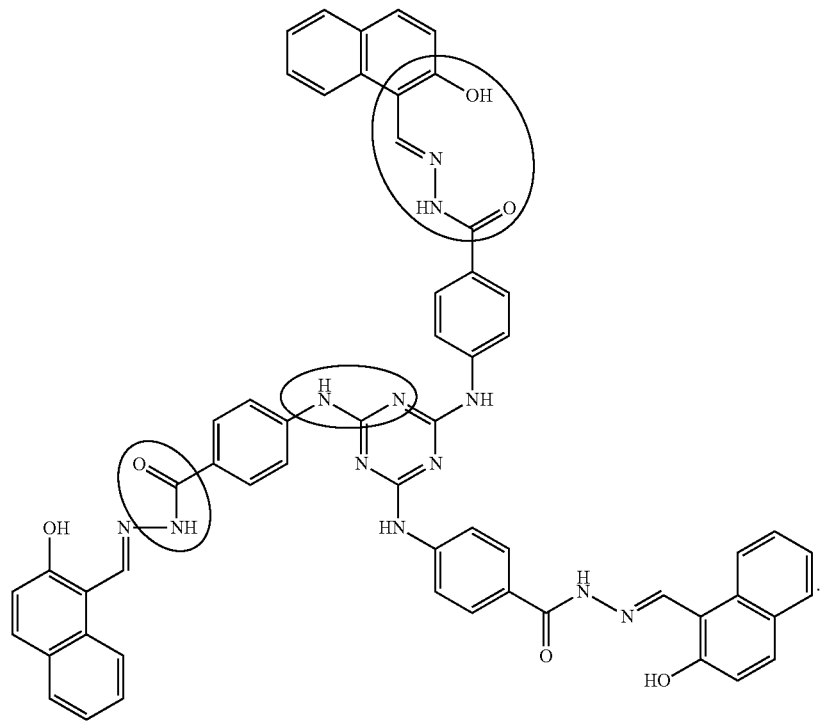

For example, FIG. 2 is a schematic diagram of forming molecules of a partner layer provided by an embodiment of the present disclosure, wherein a first solution 10 interacts with metal ions 20 to form a material 30 of the partner layer.

For example, in a case that the material of the metal film is copper, the partner layer has a chemical formula of $Cu_6C_{228}H_{156}N_{48}O_{24} \cdot 4C_3H_7NO$.

In a case that the material of the metal film is nickel, the partner layer has a chemical formula of $Ni_6C_{228}H_{156}N_{48}O_{24} \cdot 4C_3H_7NO$.

It should be noted that, depending on the various material of the metal film, the valence state of the metal ion may be different, and the number of the metal ion may be also different.

For example, a duration of treating the metal film with the first solution by using the wet etching equipment is more than or equal to about 2 minutes, and the temperature for the treatment is about 40° C. to 50° C. The metal film does not need to be washed after the treatment.

It should be noted that, the process of forming the hydrogen bond is as follows: a hydrogen atom is first covalently bonded to an atom X having a large electronegativity, and becomes close to an atom Y with a large electronegativity and a small radius. Between the atom X and the atom Y, hydrogen functions as a medium to generate a special intermolecular or intramolecular interaction in a In at least one embodiment of the present disclosure, the metal film is treated with the first solution to form a partner layer, and the partner layer mainly includes a triazine ring, an imino group, an amido group, an aromatic ring, etc.

For example, a molecule of a partner layer material includes four triazine rings, wherein the nitrogen atoms of the triazine rings do not form hydrogen bonds with any molecules, and can act as a hydrogen bond acceptor for forming a hydrogen bond with a guest molecule. Each of the triazine rings is surrounded by three imino groups, and the three imino groups do not form hydrogen bonds with any solvent molecules and can act as a hydrogen bond donor for forming a hydrogen bond with a guest molecule. The hydrogen bond formed by the nitrogen atoms of the triazine rings and the imino groups is similar to the mode of hydrogen bond formed by an alkali base in the nature. The hydrogen bond formed with the guest molecule is of a type similar to a double helix. In the molecule of the partner layer, there are twelve amido groups, each of which can form two types of hydrogen bonds with the guest molecule. The oxygen atom in the carbonyl can act as a hydrogen bond acceptor, and the hydrogen in the amido can act as the hydrogen bond donor. A plurality of aromatic rings in the molecule of the partner layer can be used as action sites to interact with the photoresist molecule. That is to say, the partner layer in the embodiment of the present disclosure acts as both the hydrogen bond donor and the hydrogen bond acceptor. For example, the guest molecule may refer to the molecule in the photoresist material.

Step S103: patterning the metal film on the surface of which the partner layer is formed to provide the electrode pattern.

For example, a photoresist is applied on the metal film and then the photoresist is exposed and developed to form a photoresist pattern. The photoresist pattern is used as a mask to etch the metal film, and the photoresist is stripped to form the electrode pattern.

For example, the photoresist may be applied by a spin coating method, a knife coating method or a roller coating method.

For example, an interval between the exposing and developing the photoresist and the forming the partner layer is less than or equal to about 30 minutes. That is, the photoresist is applied, exposed and developed within 30 minutes after the partner layer is formed.

It should be noted that, the photoresist does not need to be washed before being exposed and developed, and a temperature of pre-baking and post-baking of the photoresist in the process of forming the photoresist pattern is not higher than 130° C.

Figure 3:
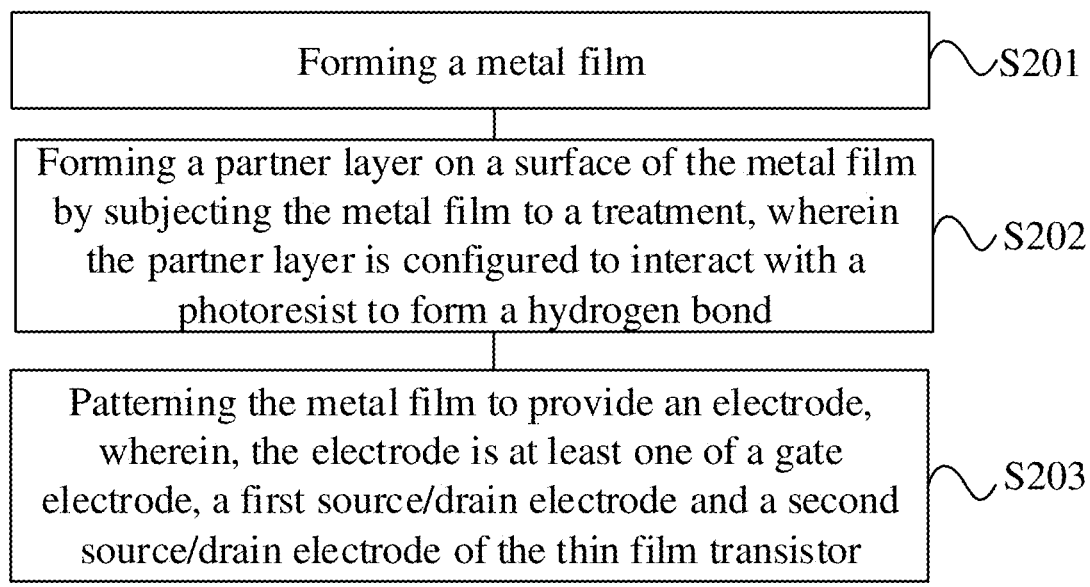
FIG. 3 is a flowchart of a manufacturing method of a thin film transistor provided by an embodiment of the present disclosure.

At least one embodiment of the present disclosure further provides a manufacturing method of a thin film transistor. For example, FIG. 3 is a flowchart of a manufacturing method of a thin film transistor provided by an embodiment of the present disclosure. As illustrated in FIG. 3, the manufacturing method of the thin film transistor includes:

Step S201: forming a metal film.

For example, a material of the metal film includes a conductive metal material such as copper, aluminum, molybdenum, zinc, nickel or neodymium, or an alloy material formed by the above metal materials.

For example, the material of the metal film is a copper-based metal. The copper-based metal has the characteristics of low resistivity and good electrical conductivity, so it can enhance signal transmission rate of the source electrode and the drain electrode, and can improve a display quality.

For example, the copper-based metal is copper (Cu), copper-zinc alloy (CuZn), copper-nickel alloy (CuNi) or copper-zinc-nickel (CuZnNi), or any other stable copper-based metal alloy.

For example, a thickness of the metal film is about 200 nm to 400 nm. For example, the thickness of the metal film is 200 nm, 230 nm, 250 nm, 300 nm, 350 nm, 380 nm or 400 nm.

For example, the metal film can be deposited by a chemical vapor deposition (CVD) process, an evaporation process or a sputtering process. However, embodiment of the present disclosure are not limited to the above deposition processes.

Step S202: forming a partner layer on a surface of the metal film by subjecting the metal film to a treatment, wherein the partner layer is configured to interact with a photoresist to form a hydrogen bond.

For example, the treatment comprises: treating the metal film with a first solution by using a wet etching equipment.

For example, the first solution comprises dimethylformamide as a solvent, and comprises a mixture of nitric acid and a compound having a molecular formula of $C_{57}H_{42}N_{12}O_6 \cdot H_2O$ as a solute. The compound has a structural formula of:

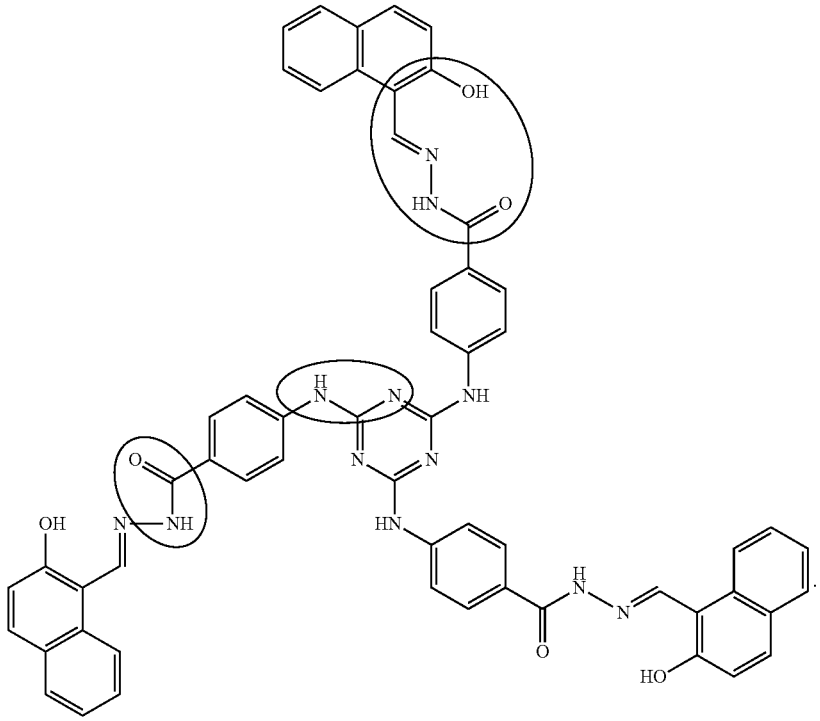 [SMILES: O=C(N/N=C/c1c(O)ccc2ccccc12)c1ccc(Nc2nc(Nc3ccc(C(=O)N/N=C/c4c(O)ccc5ccccc45)cc3)nc(Nc3ccc(C(=O)N/N=C/c4c(O)ccc5ccccc45)cc3)n2)cc1]

For example, the compound is made from methyl aminobenzoate, glacial acetic acid, cyanuric chloride, hydrazine hydrate, ethanol and 2-hydroxyl-1-naphthalaldehyde. The compound is an organic macromolecular material.

For example, a duration of treating the metal film with the first solution by using the wet etching equipment is more than or equal to about 2 minutes, and the temperature for the treatment is about 40° C. to 50° C. The metal film does not need to be washed after the treatment.

It should be noted that, the process of forming the hydrogen bond is as follows: a hydrogen atom is first covalently bonded to an atom X having a large electronegativity, and becomes close to an atom Y with a large electronegativity and a small radius. Between the atom X and the atom Y, hydrogen functions as a medium to generate a special intermolecular or intramolecular interaction in a form of X—H . . . Y, thereby forming the hydrogen bond. The atom Y is F, O or N and so on which has a partial negative charge. The hydrogen bond can be formed between the same kind of molecules, for example, the hydrogen bond can be formed between water molecules. It can also be formed between different kind of molecules, for example between ammonia and water ($NH_3.H_2O$). The hydrogen bond is a special molecular force, and its bond energy is smaller than that of a chemical bond, but larger than that of a usual intermolecular force.

In at least one embodiment of the present disclosure, the metal film is treated with the first solution to form a partner layer, and the partner layer mainly includes a triazine ring, an imino group, an amido group, an aromatic ring, etc. A molecule of a partner layer material includes four triazine rings, wherein the nitrogen atoms of the triazine rings do not form hydrogen bonds with any molecules, and can act as a hydrogen bond acceptor for forming a hydrogen bond with a guest molecule. Each of the triazine rings is surrounded by three imino groups, and the three imino groups do not form hydrogen bonds with any solvent molecules and can act as a hydrogen bond donor for forming a hydrogen bond with a guest molecule. The hydrogen bond formed by the nitrogen atoms of the triazine rings and the imino groups is similar to the mode of hydrogen bond formed by an alkali base in the nature. The hydrogen bond formed with the guest molecule is of a type similar to a double helix. In the molecule of the partner layer, there are twelve amido groups, each of which can form two types of hydrogen bonds with the guest molecule. The oxygen atom in the carbonyl can act as a hydrogen bond acceptor, and the hydrogen in the amido can act as the hydrogen bond donor. A plurality of aromatic rings in the molecule of the partner layer can be used as action sites to interact with the photoresist molecule. That is to say, the partner layer in the embodiment of the present disclosure acts as both the hydrogen bond donor and the hydrogen bond acceptor. For example, the guest molecule may refer to the molecule in the photoresist material.

Step S203: patterning the metal film on the surface of which the partner layer is formed to provide the electrode pattern, wherein, the electrode is at least one of a gate electrode, a first source/drain electrode and a second source/drain electrode of the thin film transistor.

For example, a photoresist is applied on the metal film and then the photoresist is exposed and developed to form a photoresist pattern. The photoresist pattern is used as a mask to etch the metal film, and the photoresist is stripped to form the electrode pattern.

For example, the photoresist may be applied by a spin coating method, a knife coating method or a roller coating method.

For example, an interval between the exposing and developing the photoresist and the forming the partner layer is less than or equal to about 30 minutes. That is, the photoresist is applied, exposed and developed within 30 minutes after the partner layer is formed.

It should be noted that the photoresist does not need to be washed before being exposed and developed, and a temperature of baking the photoresist in the process of forming the photoresist pattern is not higher than 130° C.

For example, the patterning process includes: coating the metal film with a photoresist; exposing and developing the photoresist to form a photoresist retention region and a photoresist removal region; removing the metal film in the photoresist removal region by an etching process; stripping the photoresist in the photoresist retention region to form a first source/drain electrode and a second source/drain electrode or a gate electrode. Herein, the photoresist retention region corresponds to a region for forming the first source/drain electrode and the second source/drain electrode or the gate electrode, and the photoresist removal region is a region outside the photoresist retention region.

In at least one embodiment of the present disclosure, during patterning the metal film on the surface of which the partner layer is formed, hydrogen bond generated by the interaction between the molecules in the partner layer with the molecules in the photoresist effectively improves the adhesion between the photoresist and the metal material. As such, the photoresist is not easy to fall off during etching the metal film, and therefore the widespread use of the thin film transistor can be achieved.

For example, FIG. 4(a) to FIG. 4(k) are process diagrams of a manufacturing method of the thin film transistor provided by an embodiment of the present disclosure. With reference to FIG. 4(a) to FIG. 4(k), a manufacturing method of a thin film transistor provided by at least one embodiment is further illustrated by taking the gate electrode, the first source/drain electrode and the second source/drain electrode each including a partner layer for example.

Step S301: as illustrated in FIG. 4(a), forming an active layer 12 on a base substrate 11.

For example, the base substrate 11 may be a glass substrate or a plastic substrate, which is not limited in the embodiments of the present disclosure.

For example, before forming the active layer 12, it is also possible to perform a pre-cleaning operation on the base substrate 11.

For example, the process of forming the active layer 12 includes: depositing an amorphous silicon layer on the base substrate 11, subjecting the amorphous silicon layer to an excimer laser annealing treatment so as to crystallize the amorphous silicon layer into a polycrystalline silicon layer, and applying a photoresist and exposing, developing, etching, stripping the photoresist and other processes to forming the active layer 12.

For example, before forming the active layer 12, the manufacturing method further includes: depositing a first insulating layer on the base substrate 11. For example, materials useful for forming the first insulating layer include silicon nitride ($SiN_x$), silicon oxide ($SiO_x$), aluminum oxide ($Al_2O_3$), aluminum nitride (AlN) or other suitable materials.

For example, in at least one embodiment of the present disclosure, the amorphous silicon layer is deposited on a buffer layer by a chemical vapor deposition (CVD) process, an evaporation process or a sputtering process. The amorphous silicon is crystallized into the polycrystalline silicon by an excimer laser annealing or a solid phase crystallization, and then a desired polycrystalline silicon pattern is formed by a patterning process. For example, the active layer 12 is the polycrystalline silicon layer.

Step S302: as illustrated in FIG. 4(b), a gate insulating layer 13 is formed on the active layer 12, and the base substrate 11 is covered by the gate insulating layer 13.

In at least one embodiment of the present disclosure, for example, the gate insulating layer 13 is deposited on the active layer by a chemical vapor deposition (CVD) process, an evaporation process or a sputtering process.

For example, gate insulator 13 may be a silicon oxide layer, a silicon nitride layer, or a composite insulator layer composed of silicon oxide and silicon nitride, etc. The embodiment of the present application is not limited to these materials.

is dimethylformamide, and the solute of the first solution is a mixture of a compound $H_6TBMN$ and nitric acid. The compound H6TBMN has a mass percentage of from about 30% to about 50% in the first solution, and the compound H6TBMN is an organic macromolecular material.

For example, the compound has a molecular formula of $C_{57}H_{42}N_{12}O_6 \cdot H_2O$, and a structural formula of

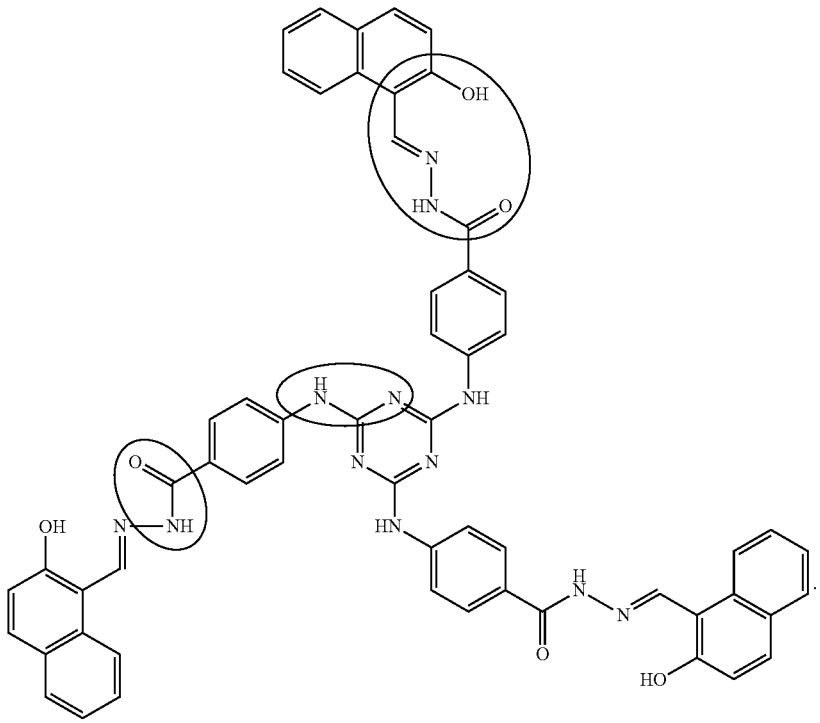 [SMILES: O=C(N/N=C/c1c(O)ccc2ccccc12)c1ccc(Nc2nc(Nc3ccc(C(=O)N/N=C/c4c(O)ccc5ccccc45)cc3)nc(Nc3ccc(C(=O)N/N=C/c4c(O)ccc5ccccc45)cc3)n2)cc1]

Step S303: as illustrated in FIG. 4(c), depositing the first metal film 141 on the gate insulating layer 13.

For example, a material of the first metal film 141 includes a conductive metal material such as copper, aluminum, molybdenum, zinc, nickel or neodymium, or an alloy material formed by the above metal materials.

For example, the material of the metal film is a copper-based metal. The copper-based metal has the characteristics of low resistivity and good electrical conductivity, so it can enhance signal transmission rate of the source electrode and the drain electrode, and can improve a display quality.

For example, the copper-based metal is copper (Cu), copper-zinc alloy (CuZn), copper-nickel alloy (CuNi) or copper-zinc-nickel (CuZnNi), or any other stable copper-based metal alloy. The embodiment of the present application is not limited to these materials.

For example, the first metal film 141 can be deposited on the gate insulating layer 13 by a chemical vapor deposition (CVD) process, an evaporation method or a sputtering process.

Step S304: as illustrated in FIG. 4(d), a partner layer 142 is formed on a surface of the first metal film 141 by subjecting the first metal film 141 to a treatment, wherein the molecules of the partner layer interacts with the molecules of the photoresist to form a hydrogen bond.

In at least one embodiment of the present disclosure, the metal film is treated with a first solution by using a wet etching equipment, wherein the solvent of the first solution For example, a duration of treating the metal film with the first solution by using the wet etching equipment is more than or equal to 2 minutes, and the temperature for the treatment is about 40° C. to 50° C. The metal film does not need to be washed after the treatment.

Figure 4:
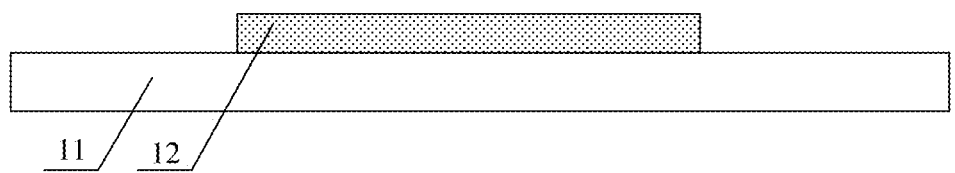
FIG. 4(a) to FIG. 4(k) are process diagrams of a manufacturing method of a thin film transistor provided by an embodiment of the present disclosure.
Figure 4:
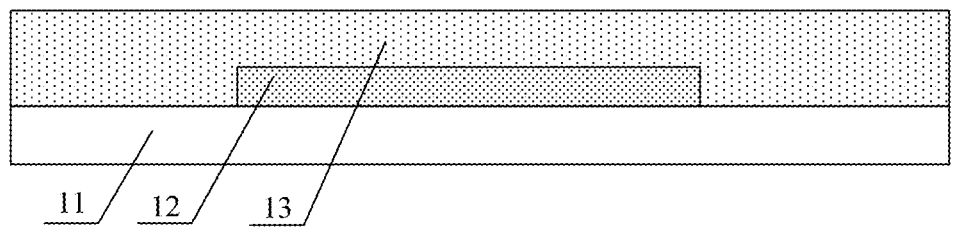
Figure 4:
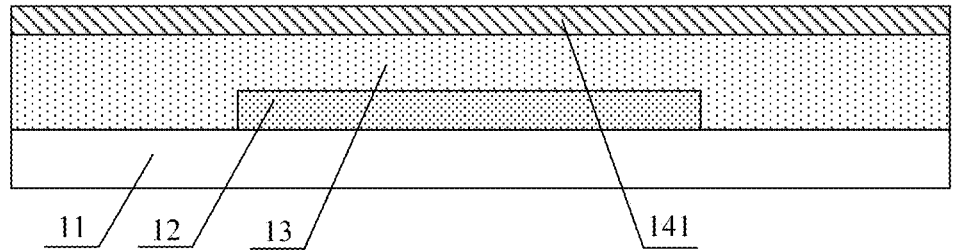
Figure 4:
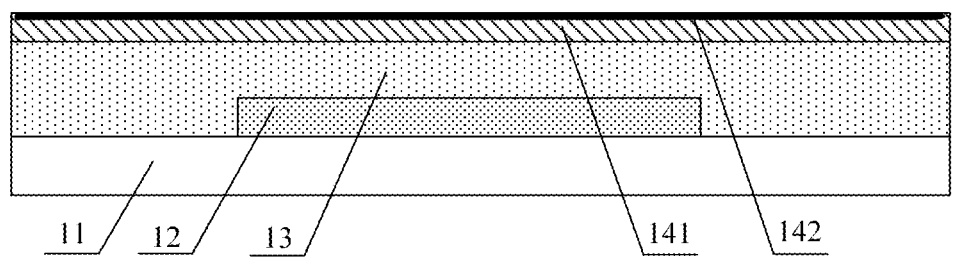
Figure 4:
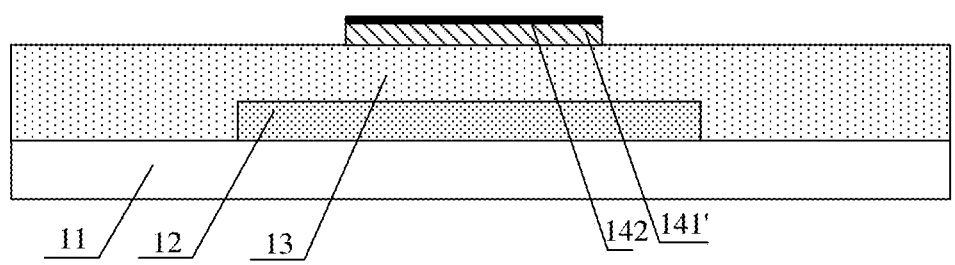
Figure 4:
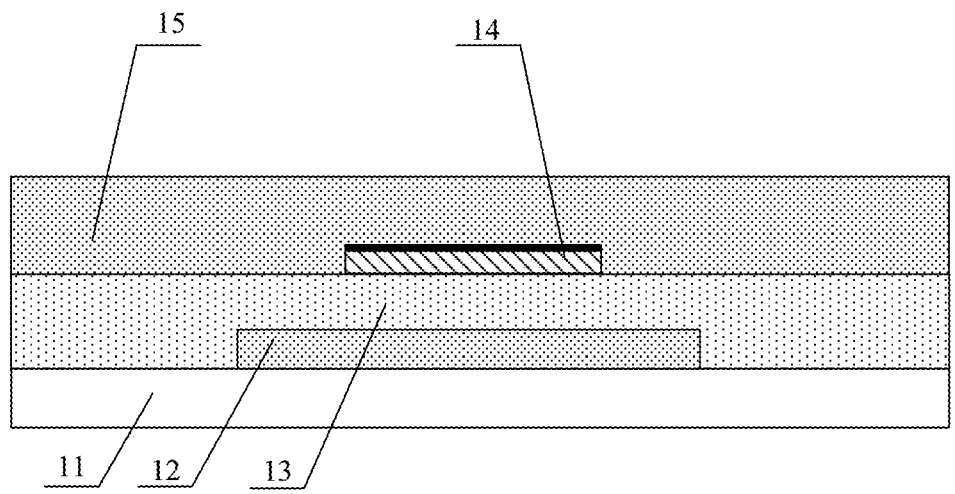
Figure 4:
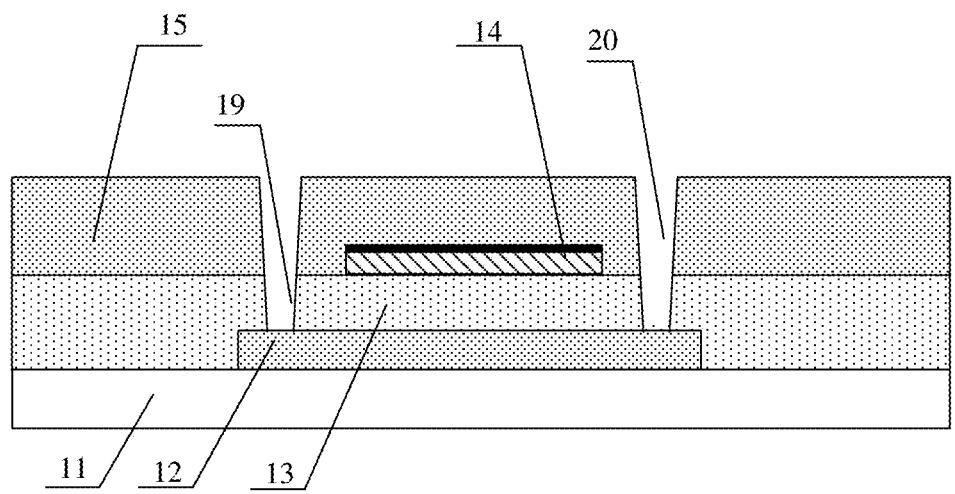
Figure 4:
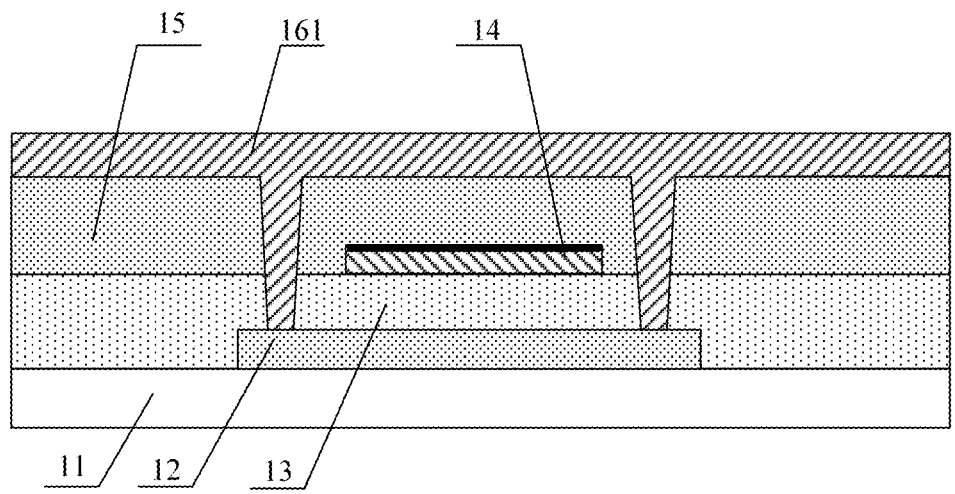
Figure 4:
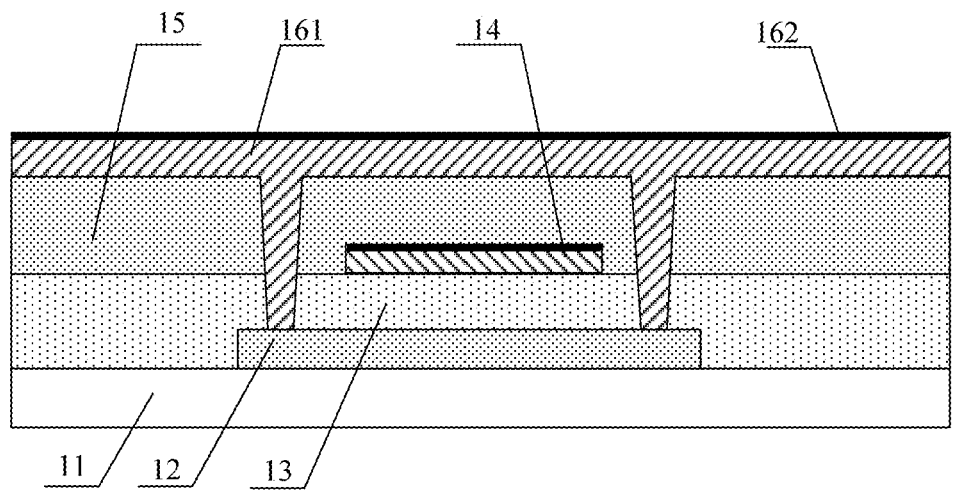
Figure 4:
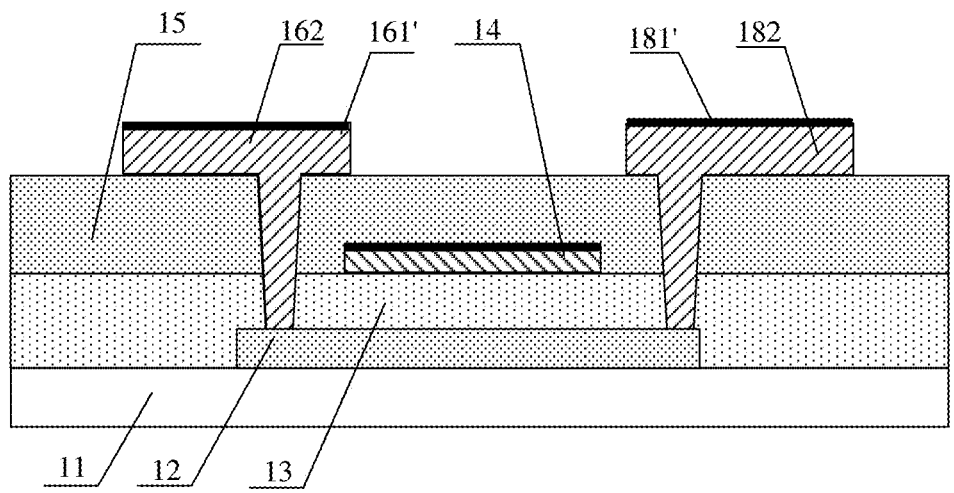
Figure 4:
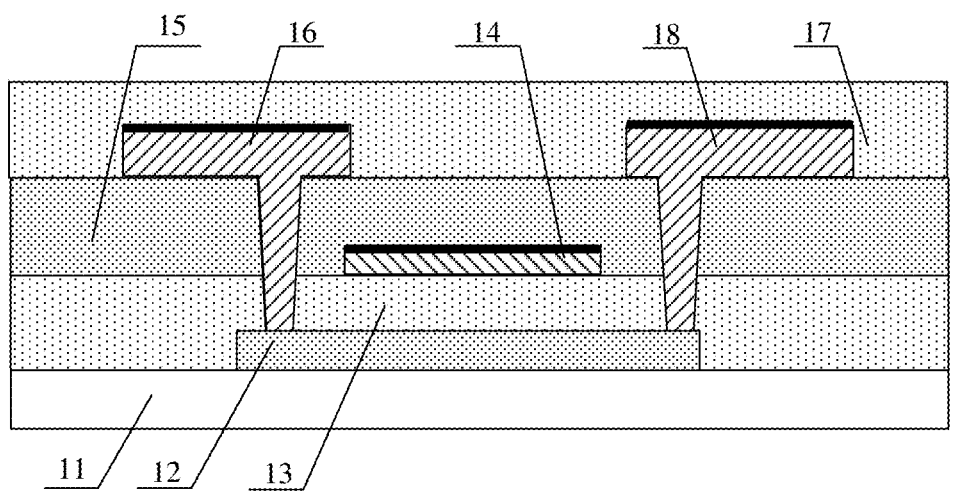

Step S305, as illustrated in FIG. 4 (e), forming a gate electrode 14 by a patterning process.

For example, forming the gate electrode by the patterning process includes: applying a photoresist on the first metal film on the surface of which the partner layer is formed; exposing and developing the photoresist to form a photoresist pattern; etching the first metal film by using the photoresist pattern as a mask; and stripping the photoresist to form the gate electrode.

For example, the gate electrode 14 includes a conductive layer 141' and a partner layer 142 formed on the conductive layer 141'.

For example, an interval between the exposing and developing the photoresist and the forming the partner layer is less than or equal to about 30 minutes, and the photoresist does not need to be washed before being exposed and developed. In the pattern process, a temperature of baking the photoresist is not higher than 130° C.

Step S306, as illustrated in FIG. 4(f), an interlayer dielectric layer 15 is formed on the gate electrode 14 and covers the entire base substrate 11.

For example, the interlayer dielectric layer 15 is deposited on the gate electrode 14 by a CVD process, an evaporation process or a sputtering process to protect the gate electrode 14 and isolate the gate electrode 14 from a first source/drain electrode and a second source/drain electrode subsequently formed.

For example, a material of the interlayer dielectric layer 15 includes silicon oxide, silicon nitride, etc., and the embodiment of the present disclosure does not limit to these materials.

Steps S307, as illustrated in FIG. 4(g), a first via hole 19 and a second via hole 20 penetrating from the interlayer dielectric layer 15 and the gate insulating layer 13 to the active layer 12 are formed by the patterning process including applying, exposing, developing, etching and stripping the photoresist. The first via 19 is used for connecting the first source/drain electrode subsequently formed with the active layer 12, and the second via 20 is used for connecting the second source/drain electrode subsequently formed with the active layer 12.

Step S308, as illustrated in FIG. 4(h), depositing a second metal film 161 on the interlayer dielectric layer 15.

For example, a material of the second metal film includes a conductive metal material such as copper, aluminum, molybdenum, zinc, nickel or neodymium, or an alloy material formed by the above metal materials.

For example, the material of the metal film is a copper-based metal. The copper-based metal has the characteristics of low resistivity and good electrical conductivity, so it can enhance signal transmission rate of the source electrode and the drain electrode, and can improve a display quality.

For example, the copper-based metal is copper (Cu), copper-zinc alloy (CuZn), copper-nickel alloy (CuNi) or copper-zinc-nickel (CuZnNi), or any other stable copper-based metal alloy. The embodiment of the present disclosure is not limited to these materials. It should be noted that, the material of the first metal film and the material of the second metal film may be the same or be different from each other, which is not limited in the present disclosure.

For example, the second metal film can be deposited on the interlayer dielectric layer by a chemical vapor deposition (CVD) process, an evaporation method or a sputtering process.

Step S309, as illustrated in FIG. 4(i), the second metal film 161 is treated to form a partner layer 162 on the surface of the second metal film 161. For example, the molecules of the partner layer 162 interact with the molecules of the photoresist to form hydrogen bonds.

In at least one embodiment of the present disclosure, the metal film is treated with a first solution by using a wet etching equipment, wherein the first solution comprises dimethylformamide as a solvent, and comprises a mixture of a compound of $H_6TBMN$ and nitric acid as a solute. The compound H6TBMN has a mass percentage of from about 30% to about 50% in the first solution.

For example, a duration of treating the metal film with the first solution by using the wet etching equipment is more than or equal to about 2 minutes, and the temperature for the treatment is about 40° C. to 50° C. The first metal film does not need to be washed after the treatment.

Step S310, as illustrated in FIG. 4(j), forming the first source/drain electrode 16 and the second source/drain electrode 18 by a patterning process.

For example, forming the first source/drain electrode 16 and the second source/drain electrode 18 by the patterning process includes: applying a photoresist on a second metal film; exposing and developing the photoresist to form a photoresist pattern; etching the second metal film by using the photoresist pattern as a mask; and stripping the photoresist to form the first source/drain electrode 16 and the second source/drain electrode 18.

For example, the first source/drain electrode 16 includes a conductive layer 161' and a partner layer 162 formed on the conductive layer 161'; and the second source/drain electrode 18 includes a conductive layer 181' and a partner layer 182 formed on the conductive layer 181'.

For example, an interval between the exposing and developing the photoresist and the forming the partner layer is less than or equal to about 30 minutes, and the photoresist does not need to be washed before being exposed and developed. In the pattern process, a temperature of baking the photoresist is not higher than 130° C.

Step S311: as illustrated in FIG. 4(k), a passivation layer 17 is formed on the first source/drain electrode 16 and the second source/drain electrode 18.

For example, a passivation layer 17 is deposited on the first source/drain electrode 16 and the second source/drain electrode 18 by a CVD process, and a third via hole is formed in the passivation layer 17. The passivation layer 17 plays the role of protecting the first source/drain electrode 16 and the second source/drain electrode 18, and isolating the first source/drain electrode 16 and the second source/drain electrode 18 from a pixel electrode subsequently formed.

For example, the passivation layer 17 is made of silicon oxide, or silicon nitride, etc., which is not limited in the embodiment of the present disclosure.

Figure 5:
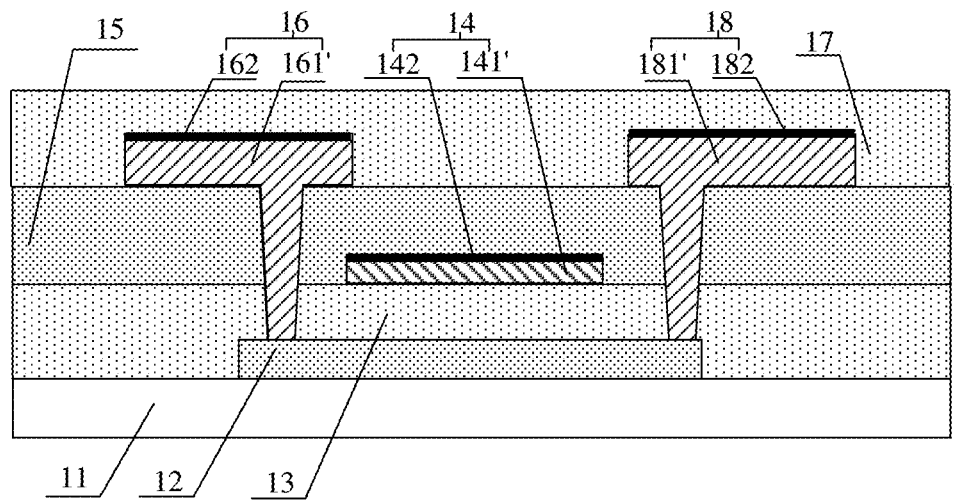
FIG. 5 is a schematic diagram of a sectional structure of a thin film transistor provided by an embodiment of the present disclosure.

At least one embodiment of the present disclosure further provides a thin film transistor. For example, FIG. 5 is a schematic diagram of a sectional structure of a thin film transistor provided by an embodiment of the present disclosure. As illustrated in FIG. 5, the thin film transistor is of top-gate type and includes: a gate electrode 14, a first source/drain electrode 16 and a second source/drain electrode 18; wherein each of the gate electrode 14, the first source/drain electrode 16 and the second source/drain electrode 18 comprises a conductive layer (141'/161'/181') and a partner layer (142/162/182), and the conductive layer is covered by the partner layer which is configured to interact with a photoresist to form a hydrogen bond.

In at least one embodiment of the present disclosure, the partner layer comprises a triazine ring, an imino group, an amido group and an aromatic ring. The molecule of the partner layer material includes four triazine rings, wherein the nitrogen atoms of the triazine rings do not form hydrogen bonds with any molecules and can act as a hydrogen bond acceptor for forming a hydrogen bond with a guest molecule. Each of the triazine rings is surrounded by three imino groups, and the three imino groups do not form hydrogen bonds with any solvent molecules, and can act as a hydrogen bond donor for forming a hydrogen bond with a guest molecule. The hydrogen bond formed by the nitrogen atoms of the triazine rings and the imino groups is similar to the mode of hydrogen bond formed by an alkali base in the nature. The hydrogen bond formed with the guest molecule is of a type similar to a double helix. In the molecule of the partner layer, there are twelve amido groups, each of which can form two types of hydrogen bonds with the guest molecule. The oxygen atom in the carbonyl can act as a hydrogen bond acceptor, and the hydrogen in the amido can act as the hydrogen bond donor. A plurality of aromatic rings in the molecule of the partner layer can be used as potential action sites to interact with the photoresist molecule. That is to say, the partner layer in the embodiment of the present disclosure acts as both the hydrogen bond donor and the hydrogen bond acceptor.

For example, the gate electrode, the first source/drain electrode and the second source/drain electrode are made of conductive metal materials such as copper, aluminum, molybdenum, zinc, nickel or neodymium, or an alloy material formed by the above metal materials.

For example, the material of the metal film is a copper-based metal. The copper-based metal has the characteristics of low resistivity and good electrical conductivity, so it can enhance signal transmission rate of the source electrode and the drain electrode, and can improve a display quality.

For example, the copper-based metal is copper (Cu), copper-zinc alloy (CuZn), copper-nickel alloy (CuNi) or copper-zinc-nickel (CuZnNi), or any other stable copper-based metal alloy. The embodiment of the present disclosure is not limited to the above materials.

For example, the thin film transistor may be a bottom-gate type thin film transistor. The only difference between it with the top-gate type thin film transistor illustrated in FIG. 5 is the position of the active layer and the gate electrode. In the bottom-gate type thin film transistor, the gate electrode is disposed on a side of the active layer close to the base substrate. The specific formation process for each layer can refer to those described for the top-gate type thin film transistor array substrate, and thus is omitted herein.

The thin film transistor provided by at least one embodiment of the present disclosure includes a gate electrode, a first source/drain electrode and a second source/drain electrode, wherein each of the gate electrode, the first source/drain electrode and the second source/drain electrode comprises a conductive layer and a partner layer which is formed on a surface of the conductive layer and configured to interact with the photoresist to form hydrogen bonds. In the process of forming an electrode with the partner layer on the surface, the molecules of the partner layer interact with the molecules of the photoresist to form hydrogen bonds, which effectively enhances the bonding force between the photoresist and the film for forming the gate electrode, the first source/drain electrode and the second source/drain electrode. As such, the photoresist is not easy to fall off in the process of etching the metal film to form the gate electrode, the first source/drain electrode or the second source/drain electrode, and therefore the widespread use of the thin film transistor can be achieved.

Figure 6:
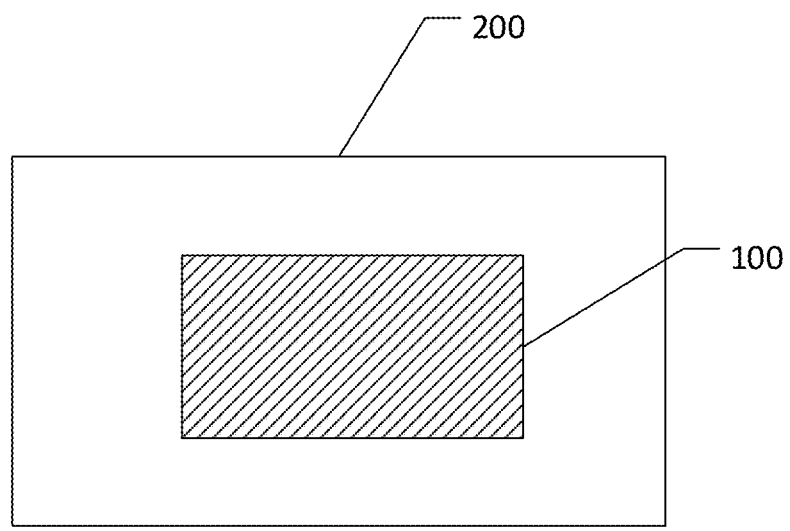
FIG. 6 is a schematic diagram of a display panel provided by an embodiment of the present disclosure.

Based on the inventive conception of the above embodiments, an embodiment of the present disclosure provides a display panel, and the display panel comprises the thin film transistor in any one of the above embodiments. For example, FIG. 6 is a schematic diagram of a display panel provided by an embodiment of the present disclosure, and the display panel 200 comprises the thin film transistor.

For example, the thin film transistor is a top-gate thin film transistor provided in the above-mentioned embodiment of the present disclosure, and its implementation principle and effect are similar to those described above, which are omitted herein.

For example, the display panel may be used for a liquid crystal display panel, an electronic paper, an OLED panel, a mobile phone, a tablet computer, a television, a display, a notebook computer, a digital photo frame, a navigator and any other products or components with a display function.

To sum up, at least one embodiments of the present disclosure provides a manufacturing method of an electrode pattern, a thin film transistor and the manufacturing method thereof, and a display panel. The manufacturing method of the electrode pattern includes: forming a metal film; forming a partner layer on a surface of the metal film by subjecting the metal film to a treatment, wherein the partner layer is configured to interact with a photoresist to form a hydrogen bond; and patterning the metal film to provide the electrode pattern. During patterning the metal film on the surface of which the partner layer is formed, hydrogen bond generated by the interaction between the partner layer with the photoresist effectively improves the adhesion between the photoresist and the metal material. As such, the photoresist is not easy to fall off during etching the metal film, and therefore the widespread use of the thin film transistor can be achieved.

Please note that:

(1) the drawings of the present disclosure are only related to the structures mentioned in the embodiments of the present disclosure, and other structures can be further obtained by general designs;

(2) for the sake of clarity, sizes of layers or regions in the drawings for describing the embodiments of the present disclosure are not drawn according to an actual scale but are exaggerated or diminished; it is understood that in a case that an element such as a layer, membrane, region, or substrate is referred to as being located "on" or "below" another element, the element may be "directly" located "on" or "below" another element, or intermediate element(s) may exist therebetween; and (3) the embodiments of the present disclosure and the features therein can be combined with each other in the absence of conflict.

What is described above is related to only the illustrative embodiments of the disclosure and not limitative to the scope of the disclosure. The scopes of the disclosure are defined by the accompanying claims.

What is claimed is:

1. A manufacturing method of an electrode pattern, comprising:

forming a metal film;

forming a partner layer on a surface of the metal film by subjecting the metal film to a treatment, wherein the partner layer is configured to interact with a photoresist to form a hydrogen bond; and patterning the metal film on the surface of which the partner layer is formed to provide the electrode pattern;

wherein the treatment comprises: treating the metal film with a first solution by using a wet etching equipment; and the first solution comprises dimethylformamide as a solvent and comprise s a mixture of nitric acid and a compound having a molecular formula of $C_{57}H_{42}N_{12}O_6 \cdot H_2O$ as a solute.

2. The manufacturing method according to claim 1, wherein the compound has a mass percentage of from about 30% to about 50%.

3. The manufacturing method according to claim 1, wherein a duration for the treatment is more than or equal to about 2 minutes, and a temperature for the treatment is from about 40° C. to about 50° C.

4. The manufacturing method according to claim 1, wherein the patterning the metal film on the surface of which the partner layer is formed to provide the electrode pattern comprises:

coating the metal film with the photoresist;

exposing and developing the photoresist;

etching the metal film; and stripping the photoresist to form the electrode pattern.

5. The manufacturing method according to claim 4, wherein an interval between the exposing and developing the photoresist and the forming the partner layer is less than or equal to about 30 minutes.

6. The manufacturing method according to claim 2, wherein a duration for the treatment is more than or equal to about 2 minutes, and a temperature for the treatment is from about 40° C. to about 50° C.

7. The manufacturing method according to claim 2, wherein the patterning the metal film on the surface of which the partner layer is formed to provide the electrode pattern comprises:
- coating the metal film with the photoresist;
- exposing and developing the photoresist;
- etching the metal film; and
- stripping the photoresist to form the electrode pattern.

8. A manufacturing method of a thin film transistor, comprising:
- forming a metal film;
- forming a partner layer on a surface of the metal film by subjecting the metal film to a treatment, wherein the partner layer is configured to interact with a photoresist to form a hydrogen bond; and
- patterning the metal film on the surface of which the partner layer is formed to provide an electrode;
- wherein the treatment comprises: treating the metal film with a first solution by using a wet etching equipment;
- the first solution comprises dimethylformamide as a solvent and comprises a mixture of nitric acid and a compound having a molecular formula of $C_{57}H_{42}N_{12}O_6 \cdot H_2O$ as a solute;
- the electrode is at least one of a gate electrode, a first source/drain electrode and a second source/drain electrode of the thin film transistor.

9. The manufacturing method according to claim 8, wherein the compound has a mass percentage of from about 30% to about 50%.

10. The manufacturing method according to claim 8, wherein a duration for the treatment is more than or equal to about 2 minutes, and a temperature for the treatment is from about 40° C. to about 50° C.

11. The manufacturing method according to claim 8, wherein the patterning the metal film on the surface of which the partner layer is formed to provide the electrode pattern comprises:
- coating the metal film with the photoresist;
- exposing and developing the photoresist;
- etching the metal film; and
- stripping the photoresist to form the electrode;
- wherein an interval between the exposing and developing the photoresist and the forming the partner layer is less than or equal to about 30 minutes.

12. A thin film transistor, comprising:
- a gate electrode, a first source/drain electrode and a second source/drain electrode;
- wherein at least one of the gate electrode, the first source/drain electrode and the second source/drain electrode is an electrode comprising a partner layer and a conductive layer, wherein the conductive layer is covered by the partner layer which is configured to interact with a photoresist to form a hydrogen bond; and
- the partner layer comprises a triazine ring, an imino group, an amido group and an aromatic ring.

13. The thin film transistor according to claim 12, wherein the partner layer has a molecular formula of $Cu_6C_{228}H_{156}N_{48}O_{24} \cdot 4C_3H_7NO$ or $Ni_6C_{228}H_{156}N_{48}O_{24} \cdot 4C_3H_7NO$.

14. The thin film transistor according to claim 12, wherein a material of the conductive layer is metal.

15. A display panel, comprising the thin film transistor according to claim 12.

* * * * *